United States Patent [19]
Rush

[11] Patent Number: 4,644,444
[45] Date of Patent: Feb. 17, 1987

[54] CLAMPING MEANS, AND MODULES AND UNITS INCLUDING CLAMPING MEANS

[75] Inventor: Derek A. Rush, London, England

[73] Assignee: Smiths Industries Public Limited Company, London, England

[21] Appl. No.: 765,775

[22] Filed: Aug. 15, 1985

[30] Foreign Application Priority Data

Aug. 17, 1984 [GB] United Kingdom ............... 8420938

[51] Int. Cl.⁴ ............................................. H05K 7/20
[52] U.S. Cl. ................................. 361/388; 361/415; 411/33; 211/41
[58] Field of Search ............... 165/80.3, 80.4, 104.33; 211/41; 24/498, 523, 524; 411/32, 33; 357/81; 361/386, 387, 388, 392, 415, 395

[56] References Cited

U.S. PATENT DOCUMENTS

| | | | |
|---|---|---|---|
| 2,734,749 | 2/1956 | Benjamin | 411/33 |
| 4,318,157 | 3/1982 | Rank | 361/388 |
| 4,366,651 | 1/1983 | Thomas | 411/33 |
| 4,480,287 | 10/1984 | Jensen | 361/386 |
| 4,488,842 | 12/1984 | Deutsch | 411/33 |

Primary Examiner—G. P. Tolin
Attorney, Agent, or Firm—Pollock, Vande Sande & Priddy

[57] ABSTRACT

Heat dissipation from electronic modules is improved by clamping their edges against heat-conducting fins in a housing by means of two expanding jackscrews. Each jackscrew has a shaft mounted in bearings in the module and carries a row of alternate closed rings and split rings. The closed rings are smaller in diameter than the split rings and have a circular section. The split rings are of tubular shape, having ends of circular section which engage the closed rings. The forward end of the shaft is screw-threaded to engage a fixed nut in the housing. When the shaft is screwed into the fixed nut, it pulls a connector on the module into engagement with a cooperating connector in the housing. At the same time, the closed rings are forced against the split rings, causing them to expand radially and exert a clamping force against the edges of the modules, forcing them into thermal contact with the fins in the housing.

12 Claims, 7 Drawing Figures

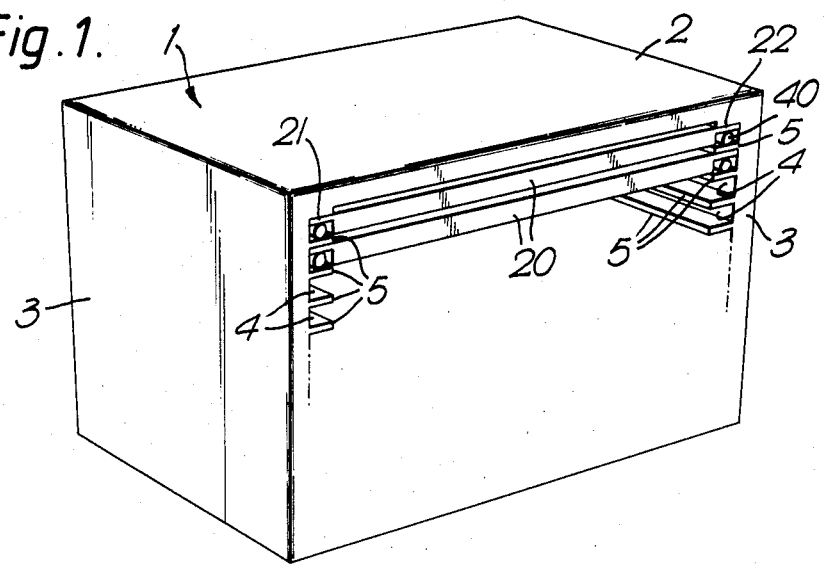
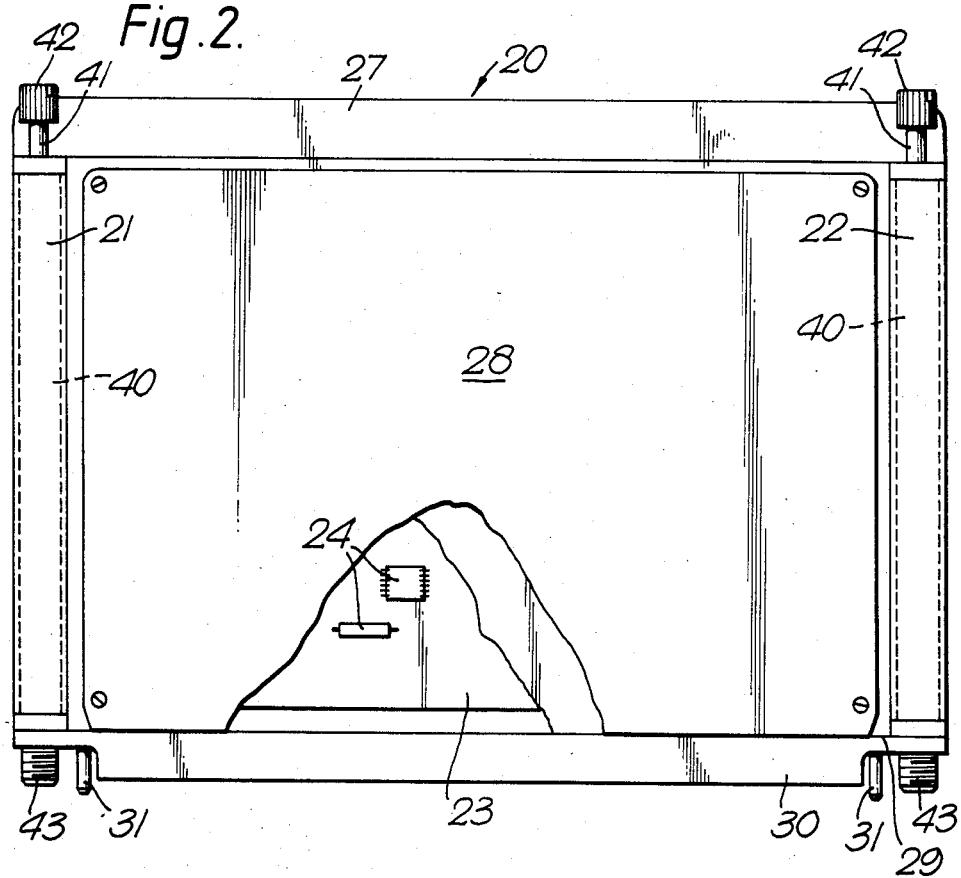

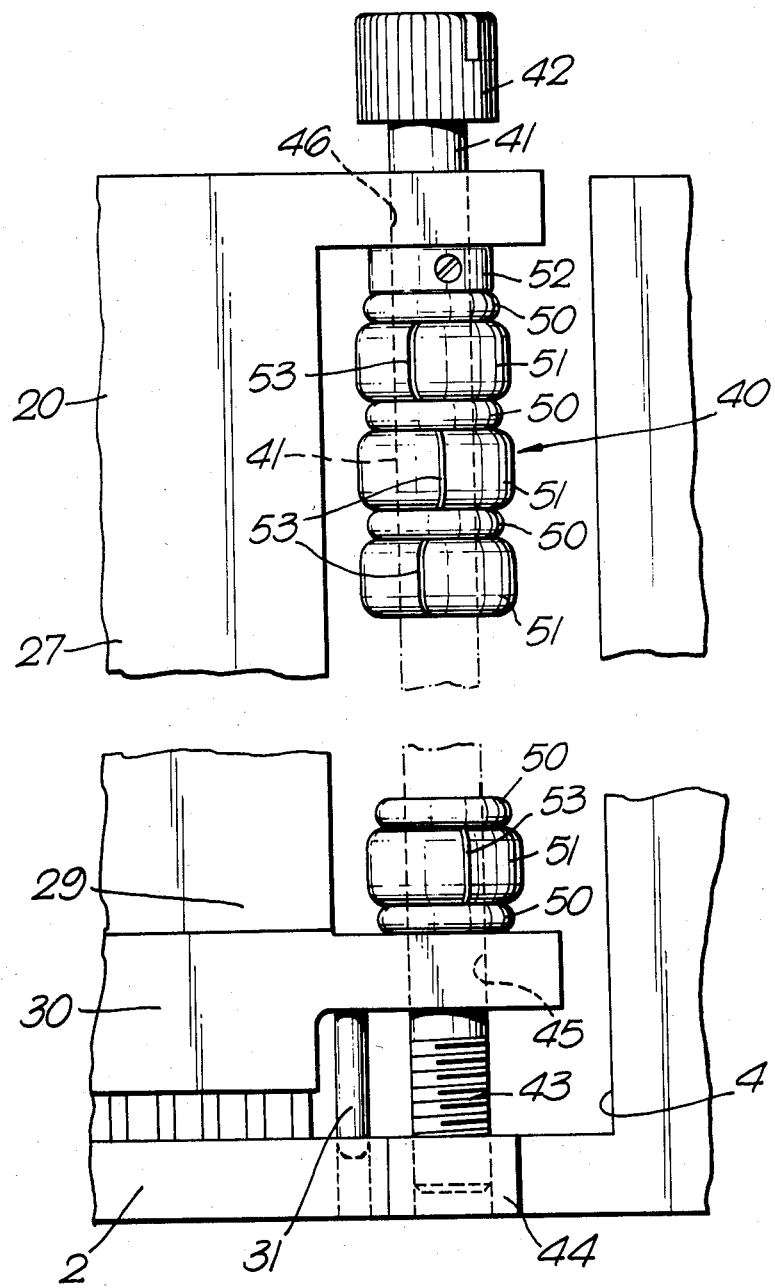

U.S. Patent  Feb. 17, 1987  Sheet 3 of 4  4,644,444
Fig. 4.
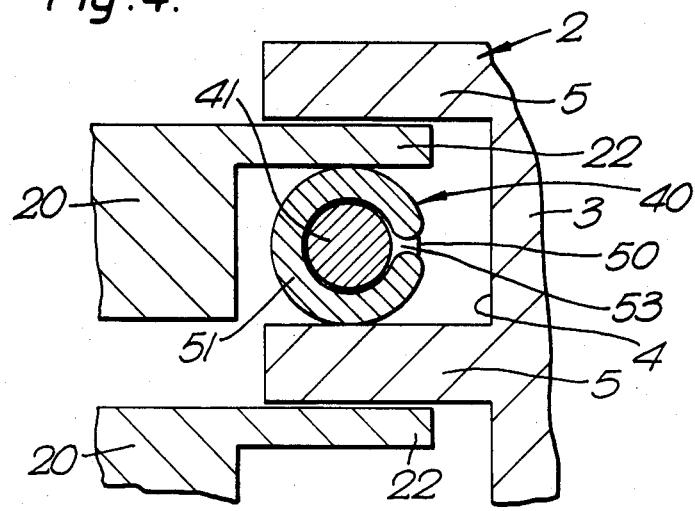
Fig. 5A.
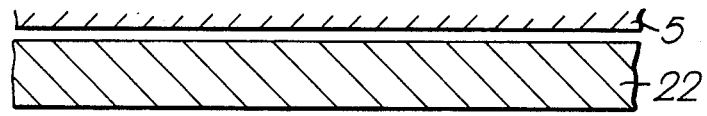
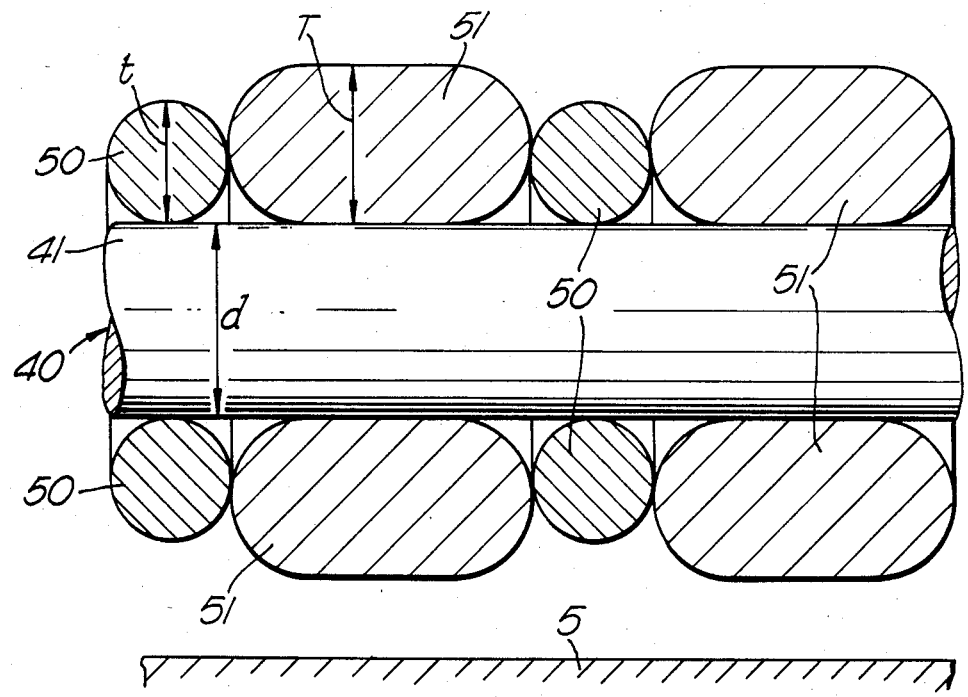

CLAMPING MEANS, AND MODULES AND UNITS INCLUDING CLAMPING MEANS

BACKGROUND OF THE INVENTION

This invention relates to clamping means, and to modules and units including clamping means.

Various arrangements are used to dissipate the heat produced by electronic modules mounted in a housing. In one such arrangement the modules include a heat-conducting frame, such as of metal, which is in good thermal contact with the heat-generating components in the module. The housing is provided with heat-dissipating walls which may be actively cooled by a coolant fluid, or by an air blower, or may simply have a large thermal capacity. The frame of the module is clamped in good thermal contact with the heat-dissipating walls so that heat generated by the module is conducted away through the frame to the walls of the housing.

One arrangement for achieving this clamping uses two jackscrews on opposite sides of the module which are screwed into the housing to retain the module in position. Each jackscrew carries two wedges with opposed inclined surfaces that are urged laterally away from one another when the jackscrew is tightened, such as to force the frame of the module into contact with the wall of the housing.

Such clamping arrangements suffer from the disadvantage that the clamping effect is relatively localised and good thermal contact is not achieved along the entire length of the module.

BRIEF SUMMARY OF THE INVENTION

It is an object of the present invention to provide clamping means by which the thermal contact can be improved.

According to one aspect of the present invention, there is provided clamping means for clamping one member relative to another member, the clamping means comprising an elongate shaft that extends parallel to a surface of the one member, a plurality of inexpansible ring members that embrace and are spaced apart along the shaft, and a plurality of radially-expansible ring members interposed between the inexpansible ring members, the clamping means including means for urging said ring members together along the length of the shaft, and said inexpansible ring members and said expansible ring members being arranged such that urging said inexpansible ring members towards said expansible ring members causes said expansible ring members to expand radially around their circumference so as to engage said one member and clamp it relative to said other member.

In this way, a clamping force is exerted by each expansible ring member so that the force can be equally distributed along the length of the one member.

The expansible ring members may be of a rigid material, the expansible ring members being split to allow for radial expansion thereof, and the expansible and inexpansible ring members being provided with cooperating surfaces arranged such that said expansible ring members expand radially outwardly on axial displacement of the inexpansible ring members. Preferably the cooperating surfaces have circular shapes. The expansible ring members may be of steel or of a compliant resilient material. The inexpansible ring members may be circular in section, and the expansible ring members may be of tubular shape with each expansible ring member being of substantially the same length. The ring members may be free to rotate about the shaft. The shaft is preferably provided with screw means that is arranged to engage cooperating screw means, such that rotation of the shaft causes axial displacement of the shaft and thereby causes axial displacement of said ring members towards one another. The shaft may be provided with a knurled knob by which the shaft can be rotated.

According to another aspect of the present invention, there is provided an electronic module including electronic circuit elements mounted on a frame and clamping means according to said one aspect of the present invention, the clamping means being arranged for clamping the electronics module in a housing.

The module preferably includes two clamping means that extend along opposite sides of the module. The module may include an edge member extending along the length of one or both of the clamping means, and the clamping means may be arranged to urge the edge member into thermal contact with a heat-conducting member. The clamping means may extend through bearings on the module that permit rotational and axial displacement of the shaft. The module may include connector means at one end of the module, the clamping means being arranged to effect displacement of the module along the length of the clamping means so as to urge the connector means into engagement with cooperating connector means.

According to a further aspect of the present invention there is provided an electronics unit including a housing and a plurality of electronics modules according to the said other aspect of the present invention, the clamping means being arranged for clamping each module in the housing.

The housing may include a plurality of channels which are adapted to receive edges of the modules, the clamping means being arranged to clamp the edges of the modules in the channels.

An electronics unit including several electronic modules with clamping means, in accordance with the present invention, will now be described, by way of example, with reference to the accompanying drawings.

BRIEF DESCRIPTION OF THE DRAWINGS

FIG. 1 is a schematic perspective view of the unit;

FIG. 2 is a plan view of the top of one module;

FIG. 3 is a partly cut-away enlarged plan view of a part of the module, showing the clamping means;

FIG. 4 is a cross-sectional end elevation of the module showing the clamping means; and FIGS. 5A to 5C are cross-sectional side elevation view along the length of the clamping means showing its operation at different positions.

DETAILED DESCRIPTION

Figure 5B:
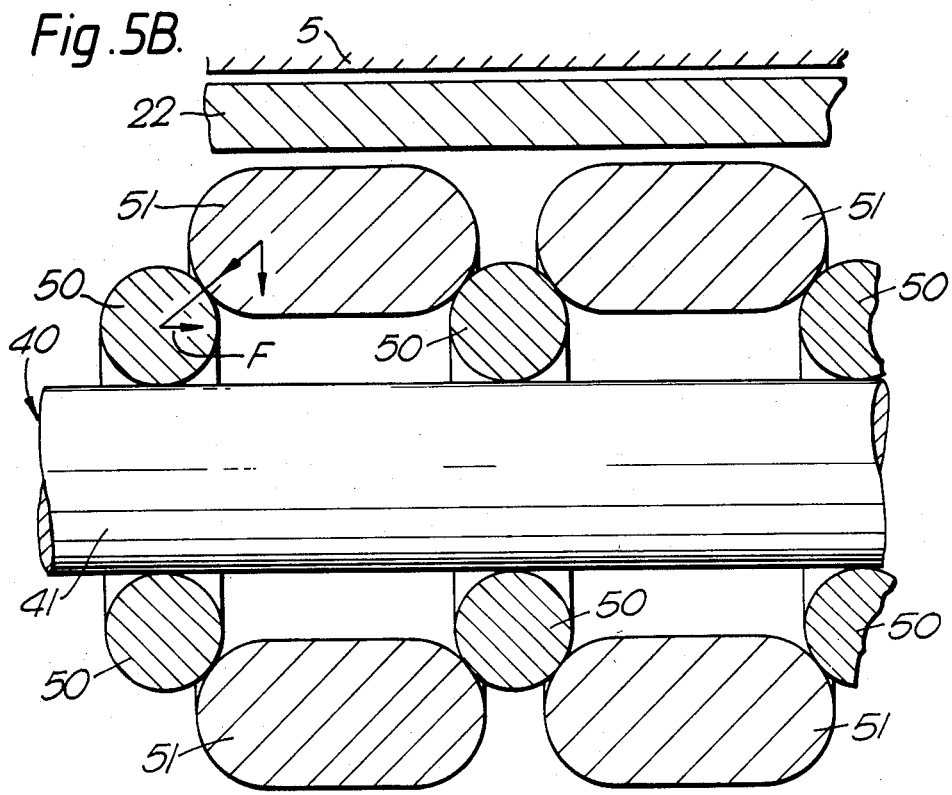

With reference to FIG. 1, the electronics unit comprises a housing 2 in which are supported several electronics modules 20. The housing 2, which is only illustrated schematically, has side walls 3 which serve to dissipate heat produced by the modules 20. In this respect, the walls 3 may be cooled, such as by means of a cooling fluid, fluid through them. Each module 20 is supported at opposite edges 21 and 22 in channels 4 in the walls 3, the channels being defined between parallel fins 5 which are in intimate thermal contact with the edges of the modules. The fins 5 are of metal of other heat-conducting material and serve to conduct heat away from the modules 20 to the walls 3 of the housing 2.

With reference now also to FIG. 2, each module 20 comprises a rectangular printed circuit board 23 on which are mounted various electronic circuit elements 24. The printed circuit board 23 is supported on a cast aluminum alloy frame 27 and is protected by sheet aluminium cover plates 28 on both sides. The frame 27 projects beyond the board 23 and supports, at its forward edge 29 a connector 30 which is electrically connected to the circuit elements 24 on the board, and which is arranged to mate with a cooperating backplane connector (not shown) mounted in the housing 2. The mounting of the connector 30 on the frame 27 preferably allows the connector to float freely to a limited extent relative to the frame, to allow for displacement of the module while it is being secured in the housing 2. The forward edge 29 of the module 20 is also provided with keying pins 31 which ensure correct orientation of the module and which can be used to give each module a unique key so that it cannot be inserted into the wrong location in the housing.

The edges 21 and 22 of the module 20 are formed by projecting edges of the frame 27, towards the upper surface of the module 20. Beneath each edge 21 and 22 the module 20 carries a clamping device or expanding jackscrew 40, as shown in more detail in FIGS. 3 and 4. Each jackscrew 40 has a stainless steel shaft 41 that extends the length of the module 20 parallel to the surface of the edge 21 or 22. At its rear end, the shaft 41 has a knurled knob 42, which may also be provided with a screwdriver slot, and by which the shaft may be rotated about its axis. At its forward end, the shaft 41 has a screw-threaded portion 43 which engages a fixed nut 44 in the housing 2. The forward and rear ends of the shaft 41 extend through respective bearings 45 and 46 at the forward and rear end of the frame 27. The bearings 45 and 46 allow both rotation of the shaft 41 about its axis, and displacement of the shaft along its axis. Intermediate the two bearings 45 and 46, the shaft 41 supports a series of alternate closed rings 50 and split rings or tubes 51; typically, there may be twenty-one closed rings and twenty open rings. The rings 50 and 51 are free to be displaced along and around the shaft 41. At its rear end, adjacent the last closed ring 50, the shaft 41 carries a thrust bushing 52 which is fixed with the shaft 41 for rotation and axial displacement with the shaft.

Figure 5C:
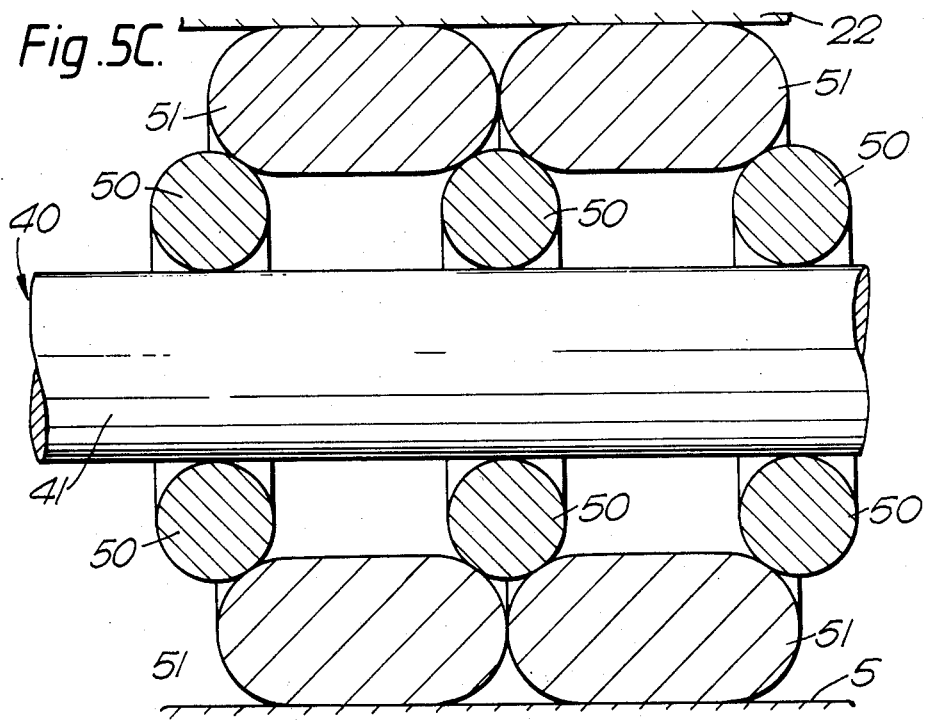

With reference now also to FIGS. 5A to 5C, each closed ring 50 is circular in shape and circular in section, having an internal diameter d of about 6.5 mm, substantially equal to the outside diameter of the shaft 41, and a thickness t of 0.3 mm. The rings 50 are preferably of a steel or other hard metal. The split rings 51 are of a spring metal such as stainless steel, and have the same internal diameter, in their natural state, as the closed rings 50. The split rings 51 are thicker than the closed rings, having a thickness T of 0.5 mm, and are elongated axially, being 5.5 mm long. Opposite ends of the rings 51 are of semicircular section, with a radius of 0.25 mm, the middle part of each ring being of cylindrical shape. Each ring 51 has a narrow slot 53 extending along its length, as shown in FIG. 3, to enable the ring to be expanded radially, the slot 53 being opened as the ring is expanded.

The two jackscrews 40 extend within the channels 4, between a fin 5 of the housing wall 3 and an edge 21 or 22 of the frame 27 of the module 20. The external diameter (d+2T) of the split rings 51 in their natural state is such as to allow free movement of the module 20 into or out of the housing 2.

In operation, the forward end of the module 20 is pushed gently into the housing 2, with the edges 21 and 22 of the module supported in opposite channels 4 in the housing, until the keying pins 31 engage appropriate keyways in the housing. The module 20 is then pushed fully in, as far as possible, so that the connector 30 on the module makes initial engagement with the connector in the housing 2. Full engagement is prevented by the projecting, forward end of the jackscrews 40 coming into contact with the rear of the housing. The jackscrews 40 are then turned by their knurled knobs 42, so that the screw threads 43 at their forward ends engage and are screwed into the nuts 44 in the housing, thereby pulling the module 20 forward and the connector 30 into full engagement. Further rotation of the jackscrews 40 causes them to effect a clamping action, urging the edges 21 and 22 of the module 20 upwards into good thermal contact with the fins 5 of the housing, along the length of the module. This is achieved because rotation of the jackscrew 40 causes the thrust bushing 52 to exert axial compression on the row of rings 50 and 51, causing radial expansion of the split rings 51. As the closed rings 50 are urged against the adjacent, respective split rings 51, they exert a force producing a reaction F directed between the centres of curvature of the contacting surfaces of the closed and split rings. This reaction F has a component directed radially, resisting expansion of the split rings 51. As the jackscrews 40 are screwed in further, the split rings 51 are expanded further by opening the slot 53, against the resilience of the split ring, as shown in FIG. 5B. As the split rings 51 expand, their upper surfaces engage the lower surface of the edge 21 or 22 of the module, while their lower surfaces engage the upper surface of the fin 5, below the edges of the module, thereby urging the upper surface of the module edges upwardly into good thermal contact with the fins 5.

Expansion of the jackscrew 40 is limited by the width of the channels 4 and the thickness of the edges 21 and 22 of the modules. The maximum expansion of the jackscrew 40 is shown in FIG. 5C, when the split rings 51 contact one another outside the closed rings 50. The external diameter of the jackscrew 40 thereby can be adjusted from a minimum of 7.5 mm (that is, the diameter (d+2T) of the split rings 51 before expansion) to a maximum of 7.925 mm when the split rings contact one another.

When the jackscrew 40 is unscrewed, the resilience of the split rings 51 cause them to contract back about the shaft 41, thereby urging the closed rings 50 rearwardly along the shaft.

It will be appreciated that, because several split rings 51 are used along the length of the jackscrew 40, the clamping force exerted on the edge of the module 20 will be applied at several points along the length of the module to ensure good thermal contact all along the edge of the module.

The length of the split rings 51 can vary from that described. They could be longer than that shown, so that they are more tubular in shape, or shorter, so that they are circular in section. Rings of different length could be used on the same jackscrew.

Where the inexpansible and expansible rings must be shaped to cooperate and produce a radial force on the expansible ring, such as is provided by the surfaces of circular section described above (although other shape surfaces are possible). The expansible ring could, however, be of a compliant resilient material, such as of a rubber or elastomer, so that an axial force exerted on the expansible ring, compresses it axially, thereby producing a radial expansion.

Instead of using a fixed nut 44 in the housing 2 and a screw threaded portion 43 on the shaft 41 to produce an axial displacement of the shaft, other arrangements are possible. For example, one or both of the bearings 45 or 46 on the module 20 itself could be replaced with a screw-threaded bore that receives a screw-threaded portion of the shaft. In this way, rotation of the shaft in one sense produces axial displacement of the shaft and urges the series of rings 50 and 51 closer together to cause a clamping action.

It will be appreciated that clamping means in accordance with the present invention could be used to exert a clamping effect on articles other than the electronic module described.

What I claim is:

1. An electronic unit comprising: a housing having a wall with a channel therein extending along the wall, and an electronic module located in said housing, said electronic module including electronic circuit elements and having an edge member that projects into said channel, and a clamping assembly that extends within the channel along the length of the edge member intermediate one face of the edge member and a surface of the channel, said clamping assembly including an elongate shaft, a plurality of inexpansible ring members that embrace and are spaced apart along the shaft, a plurality of radially-expansible ring members each interposed between a successive pair of said inexpansible ring members; and the clamping assembly being configured to urge said ring members together along the length of the shaft such that said expansible ring members expand radially within said channel around their circumference thereby to engage both the surface of the channel on one side and the face of the edge member on the opposite side thereby to urge said edge member into thermal contact with said housing.

2. An electronic unit according to claim 1, including bearings that support said shaft of said clamping assembly, and wherein the bearings permit rotational and axial displacement of the shaft.

3. An electronic unit according to claim 1, wherein said housing has a pair of opposite walls, each said wall having a channel therein extending along the wall, wherein said electronic module has two edge members extending along opposite sides of the module and projecting into a respective channel, and wherein said clamping assembly extends within each respective channel along the length of a respective edge member thereby to clamp each said edge member in thermal contact with said housing.

4. An electronic unit according to claim 1, wherein said expansible ring members are of a rigid material, said expansible ring members being split to allow radial expansion thereof, and wherein the expansible and inexpansible ring members have cooperating surfaces that cause said expansible ring members to expand radially outwards on axial displacement toward each other of said inexpansible ring members.

5. An electronic unit according to claim 4, wherein the said cooperating surfaces have circuit shapes.

6. An electronic unit according to claim 1, wherein the said expansible ring members are of steel.

7. An electronic unit according to claim 1, wherein the said expansible ring members are of a compliant resilient material.

8. An electronic unit according to claim 1, wherein the said inexpansible ring members are circular in section.

9. An electronic unit according to claim 1, wherein the said expansible ring members are of tubular shape.

10. An electronic unit according to claim 9, wherein each said expansible ring member is of substantially the same length.

11. An electronic unit according to claim 1, wherein the said ring members are free to rotate about the said shaft.

12. An electronic unit according to claim 1, wherein said shaft has a screw member that engages a cooperating screw member, such that rotation of the shaft causes axial displacement of the shaft and thereby causes axial displacement of the said ring members towards one another.

* * * * *